United States Patent [19]

Ichimiya et al.

[11] 4,310,802
[45] Jan. 12, 1982

[54] LOGICAL WAVEFORM GENERATOR

[75] Inventors: Yoshichika Ichimiya, Tokorozawa; Tsuneta Sudo, Kodaira; Hiromi Maruyama, Gyoda; Shigeru Sugamori, Gyoda; Susumu Sumida, Gyoda; Takashi Tokuno, Gyoda, all of Japan

[73] Assignees: Nippon Telegraph & Telephone Public Corp.; Takeda Riken Kogyo Kabushiki Kaisha, both of Japan

[21] Appl. No.: 69,348

[22] Filed: Aug. 24, 1979

[30] Foreign Application Priority Data

Aug. 28, 1978 [JP] Japan ................................ 53-105302

[51] Int. Cl.$^3$ ............................................... H03K 5/22
[52] U.S. Cl. ..................................... 328/110; 328/119; 307/517; 307/518; 364/701
[58] Field of Search ............... 328/110, 119, 187, 188; 307/517, 518; 364/701

[56] References Cited
U.S. PATENT DOCUMENTS

3,659,044  4/1972  Olson .................................. 328/188
3,997,798  12/1976  Breimesser ......................... 328/119

*Primary Examiner*—Eli Lieberman
*Attorney, Agent, or Firm*—Staas & Halsey

[57] ABSTRACT

Input logical data is sequentially divided by a data dividing circuit for each time slot into n data trains, of which each data block has an n time slot length. A clock signal which can be arbitrarily timed, is divided by a clock dividing circuit into a n clock signals which are displaced one time slot apart in phase and which occur with a period of n time slots. In a logical circuit, the divided clock signals are controlled by the divided data trains corresponding thereto, and the controlled clock signals are time multiplexed by a multiplexing circuit, whereby output data with which the input logical data has been timed by the clock signal is obtained.

7 Claims, 39 Drawing Figures

→ TIME

LOGICAL WAVEFORM GENERATOR

CROSS REFERENCE TO RELATED APPLICATION

Reference is hereby made to the assignees' related application Ser. No. 069,347, filed Aug. 24, 1979, entitled HIGH SPEED DATA LOGICAL COMPARISON DEVICE.

BACKGROUND OF THE INVENTION

This invention relates to a logical waveform generator which generates a logical waveform having its phase and pulse width varied on the basis of a clock signal.

The waveform generator of this kind is employed to produce a test waveform for testing a logical circuit fabricated as a semiconductor integrated circuit, for example. This is, in order to test such a logical circuit as to whether or not it performs a normal operation when simultaneously supplied at its plurality of terminals with various data, it is determined to what extent the timing of the data can be deviated and how much the widths of the data can be reduced while the circuit operates normally. For such a test, it is necessary to prepare data of various phases (timings) and widths based on a clock signal, and to apply the data to the logical circuit under test.

When the logical circuit is supplied with logical data, a certain time period is required for the logical circuit to perform the operation corresponding to the input data. This period is called a set-up time Ts. Further, an incorrect output is produced from the logical circuit unless the data is held for a certain minimum period of time called a hold-off time Th. Because of the set-up time Ts and the hold-off time Th, required in conventional logical waveform generators, a clock signal for changing the timing of data cannot be set at a desired moment throughout one time slot Tc but can be set only at a desired moment in a period Tc−(Ts+Th). Accordingly, it is impossible to obtain a desired logical waveform and to sufficiently check the logical circuit under test. Moreover, since the phase of the clock signal can be set only in the period Tc−(Ts+Th) as mentioned above, it happens that in the case of high-speed logical data, the time slot Tc is reduced, and various waveforms for testing the logical circuit essentially cannot be produced. In addition, the conventional logical waveform generators cannot generate a waveform extending over a plurality of time slots.

SUMMARY OF THE INVENTION

An object of this invention is to provide a logical waveform generator which is capable of setting the phase of a clock signal throughout one time slot, and hence is able to produce a waveform of a desired phase and width.

Another object of this invention is to provide a logical waveform generator which is capable of producing a high-speed logical waveform having a single short time slot, with a desired phase and width.

Another object of this invention is to provide a logical waveform generator which is capable of producing a logical waveform of a desired phase and width over a plurality of time slots.

Still another object of this invention is to provide a logical waveform generator which is capable of producing a logical waveform which can be employed as a test waveform for adequately testing a logical circuit.

Yet another object of this invention is to provide a logical waveform generator which is capable of selectively producing various waveforms, such as NRZ (Non-Return-to-Zero), RZ (Return-to-Zero) and EOR (Exclusive-OR) waveforms, with a desired phase and width.

In accordance with the present invention, input logical data is divided, by a data dividing circuit, into n (n being an integer larger than 1) data which are displaced one time slot apart in phase and each of which has an effective period of n time slots. Similarly, a clock signal is also divided by a clock signal dividing circuit into n clock signals which are phased one time slot apart and each of which has a period of n time slots. The clock signals thus divided are controlled by the divided data respectively corresponding thereto, in a logical circuit, and the controlled signals are combined by a multiplexing circuit to form a logical waveform of desired timing.

A second clock signal having timing different from the above-mentioned clock signal is likewise spatially divided, and these spatially divided clock signals are controlled by the above-mentioned spatially divided data respectively corresponding thereto, and the controlled outputs are multiplexed, transforming the input data into a waveform having timing different from the above-mentioned logical waveform. At least two of the plurality of input data having different timings, thus obtained, and their inverted data are selected by select gates and are compared with clock signals respectively corresponding to the selected data to detect coincidence therebetween. A flip-flop is controlled, by the coincidence outputs, to be set and reset. By selecting the above-mentioned select gates in this way, it is possible to derive, from the flip-flop, RZ, NRZ and like waveforms of various timings and pulse widths.

BRIEF DESCRIPTION OF THE DRAWINGS

FIGS. 7A–7G are a timing chart for explaining part of the operation of the device of FIG. 6.

DESCRIPTION OF THE PREFERRED EMBODIMENTS

Figure 1:
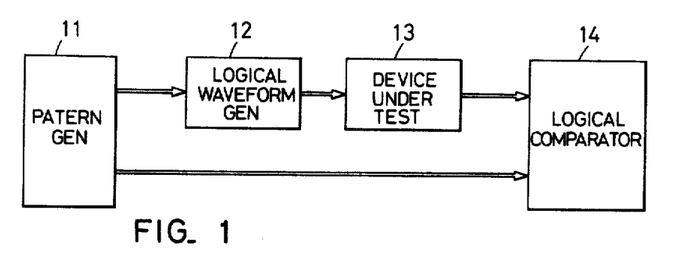
FIG. 1 is a block diagram illustrating a test device for a logical circuit, illustrating a conventional logical waveform generator.

The logical waveform generator of the present invention is used in such a test device, for example, as shown in FIG. 1, which is employed for testing semi-conductor integrated circuits of logic circuit construction. A pattern generator 11 produces, in parallel, a plurality of logical data patterns which vary with time, including test data which is supplied to a logical wave generator 12. The generator 12 converts the input data into data of various timings and widths which are respectively applied to predetermined terminal pins of a logical element under test, for example, a semi-conductor integrated circuit element 13. An expected value pattern in the output from the pattern generator 11 is provided to a logical comparator 14, wherein it is compared with output data of the logical element 13 under test to determine whether or not the output from the element 13 is correct.

The logical waveform generator 12 applies the input test data as a RZ, NRZ, EOR or like waveform to the logical element 13 under test and at the same time, the output from the logical element 13 is checked to determine how it varies when the timings of the respective test data to be supplied to its plural terminals are displaced relative to one another in their time slots and when their effective widths are changed.

Figure 2:
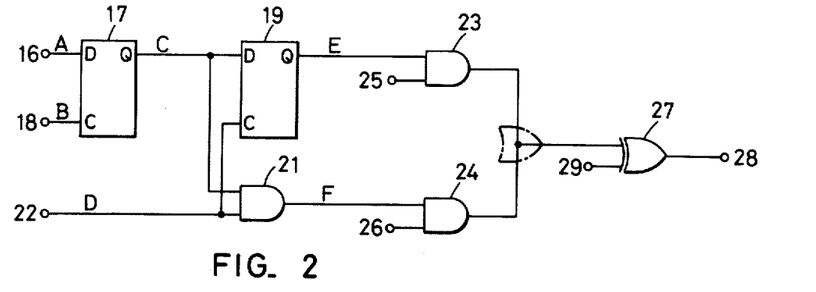
FIG. 2 is a logical circuit diagram illustrating a conventional logical waveform generator.
Figure 3A:
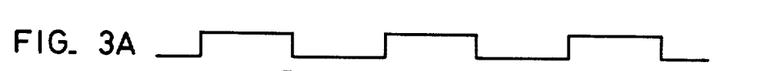
FIGS. 3A–3F are a timing chart for explaining the operation of the device shown in FIG. 2.
Figure 3B:
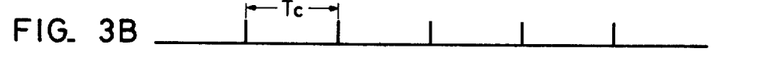
Figure 3C:
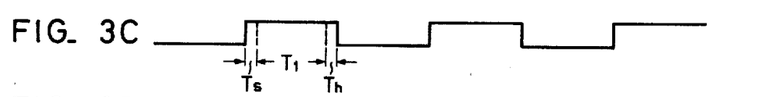
Figure 3D:
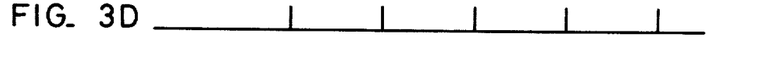
Figure 3E:
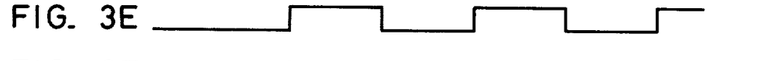
Figure 3F:
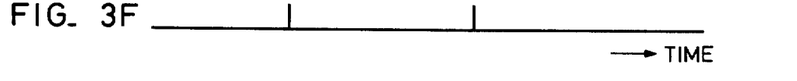

In the prior art, the logical waveform generator 12 has a construction such as that illustrated in FIG. 2. From a data input terminal 16, desired logical data, such as is shown, for example, in FIG. 3A, is supplied to a data terminal D of a flip-flop 17. This logical data is read in the flip-flop 17 by a timing clock signal (FIG. 3B) from a terminal 18. As a result, an output Q from the flip-flop 17 becomes such as shown in FIG. 3C and is applied to a data terminal D of a flip-flop 19 and an AND circuit 21. A desired clock signal, for example, such as shown in FIG. 3D, is selected from a clock signal group and is provided from a terminal 22 to a clock terminal C of the flip-flop 19 and to the AND circuit 21. Consequently, the output Q from the flip-flop 19 becomes such as is shown in FIG. 3E in which the input data from the terminal 16 is controlled in timing by the clock signal from the terminal 22, and the output from the AND circuit 21 becomes such that timed input data is sampled by the clock signal from the terminal 22. These outputs are imparted to gates 23 and 24 respectively; and when a select terminal 25 is at a high level, the output from the flip-flop 19 is selected, and when a select terminal 26 is at a high level, the output from the AND circuit 21 is selected. The outputs from the gates 23 and 24 are wired-OR'ed with each other, and the resulting output is provided via an exclusive OR circuit 27 to an output terminal 28. When a high level is applied to the exclusive OR circuit 27 from a terminal 29, the input to the circuit 27 is inverted and then provided to the output terminal 28.

The input data at the terminal 16 and the clock signal at the terminal 18 are fixed in phase, but the clock signal at the terminal 22 is selected from the clock signal group, and its phase can be varied. By changing the phase of the clock signal at the terminal 22, the phase of the output waveform available at the output terminal 28 can be altered. To perform this, timed data (FIG. 3C) must be held in the flip-flop 19. However, when supplied with the clock signal, the flip-flop 19 does not rise up immediately; instead, it requires the so-called set-up time Ts, and in order to utilize its output signal, the flip-flop 19 is required to hold its output for a certain minimum period of time; namely, the so-called hold-off time Th is needed. As a consequence, the clock signal at the terminal 22 can be varied only in a range $T_1$ (FIG. 3C) equal to one time slot Tc minus the set-up time Ts and the hold-off time Th. In the test device for logical circuits, however, it is necessary, in some cases, to set the clock signal over one entire time slot or over two time slots. In such cases, the conventional logical waveform generator of FIG. 2 cannot be used. Further, the conventional device has the drawback that when the logical element under test has high-speed operation, a severe limitation is imposed on the range in which to set the clock signal at the terminal 22.

Figure 4:
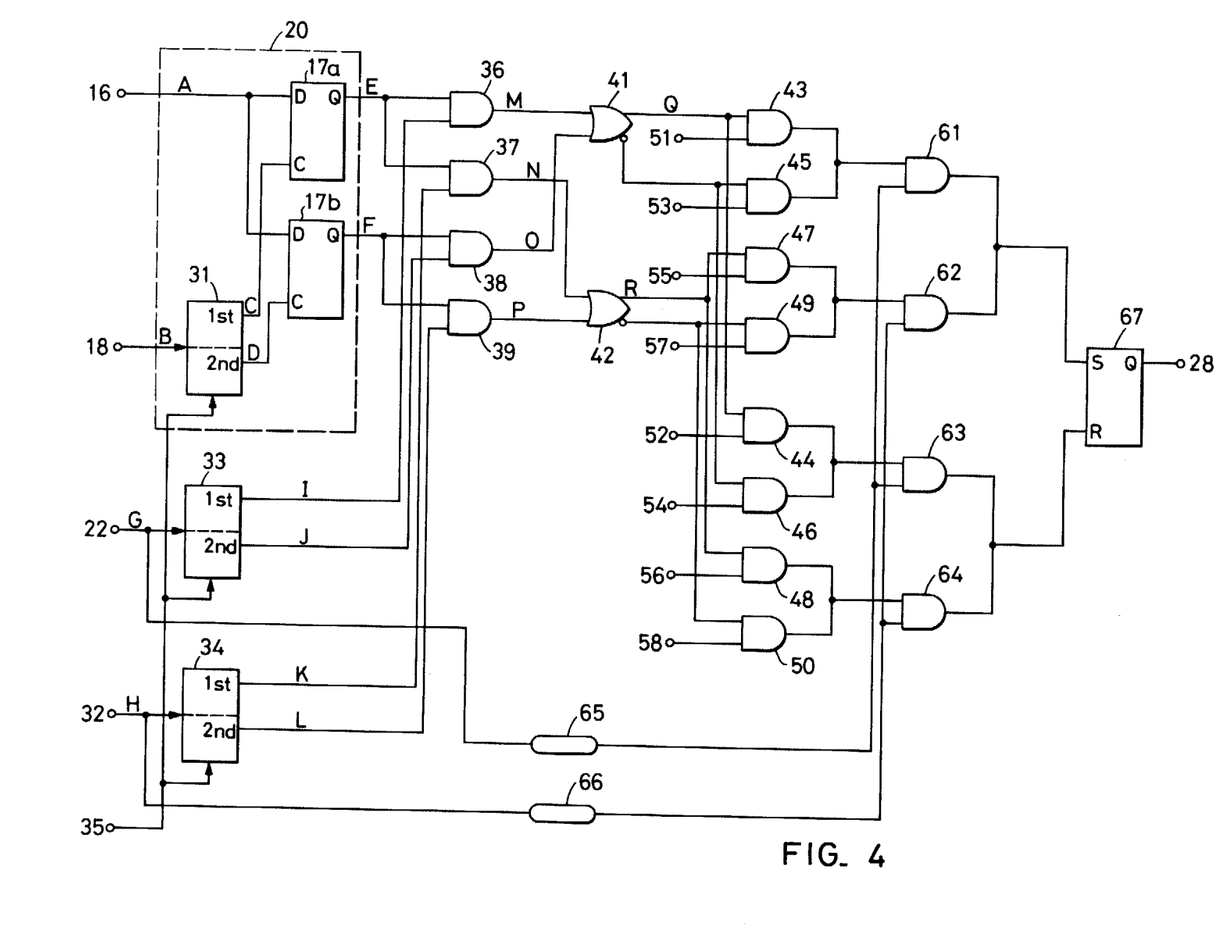
FIG. 4 is a logical circuit diagram illustrating an embodiment of the logical waveform generator of the present invention.

FIG. 4 illustrates an embodiment of the logical waveform generator of this invention, in which n=2. Desired logical data from a data input terminal 16 is provided to data terminals D of D flip-flops 17a and 17b. A timing clock signal from a terminal 18 is applied as a shift pulse to a shift register 31, and desired clock signals selected at clock signal groups, from terminals 22 and 32, are supplied as shift pulses to shift registers 33 and 34 respectively. The D flip-flops 17a and 17b are respectively supplied at their clock terminals C with first and second stage outputs from the shift register 31, and the flip-flop 17a holds the input data of a 2mth (m=0, 1, 2, ...) time slot from the terminal 16 for two time slots, whereas the flip-flop 17b holds the input data of a (2M+1)th time slot. The shift registers 31, 33 and 34 are each initially set by a command from a terminal 35, and each of them spatially divides one of the clock signals from terminals 18, 22 and 23 into clock signals of 2mth and (2m+1)th time slots, each of which has a period of two time slots. By the output clock signals of the 2mth time slot from the first stages of the shift registers 33 and 34, gates 36 and 37 are controlled, and by the second stage outputs from the shift registers 33 and 34, that is, the outputs of the (2M+1)th time slot, gates 38 and 39 are controlled.

Figure 5A:
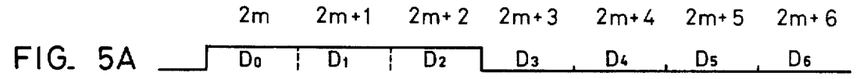
FIGS. 5A–5V are a timing chart for explaining the operation of the device shown in FIG. 4.
Figure 5B:
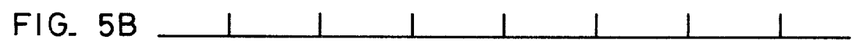
Figure 5C:
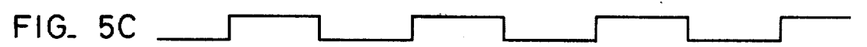
Figure 5D:
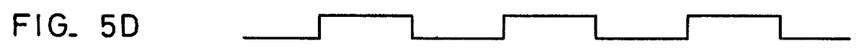
Figure 5E:
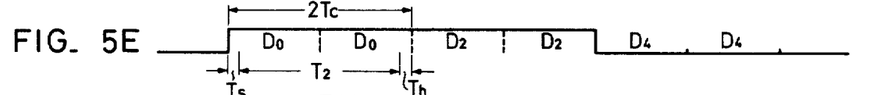
Figure 5F:
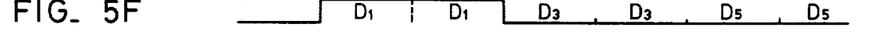

For example, as shown in FIG. 5A, input logical data $D_0, D_1, D_2, \ldots$ of 2mth, (2m+1)th, (2m+2)th ... time slots are inputted at the terminal 16. The clock signal (FIG. 5B) at the terminal 18 is spatially divided by the shift register 31 to derive at its first and second stages, the spatially divided clock signals shown in FIGS. 5C and D. By the rise of these divided clock signals, the data $D_0D_2, \ldots$ of the 2mth time slot, at the terminal 16, are respectively held in the flip-flop 17a for two time slots to provide such data as illustrated in FIG. 5E, whereas the data $D_1D_3 \ldots$ of the (2m+1)th time slot are respectively held in the flip-flop 17b for two time slots to provide such data as illustrated in FIG. 5F. In this way, the input data is spatially divided into two for each time slot, and the divided data are transformed into data, each having an effective period of two time slots. Accordingly, the flip-flops 17a and 17b and the shift register 31 constitute a data dividing circuit 20.

Figure 5G:
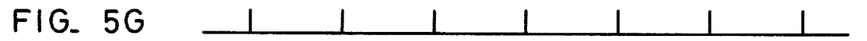
Figure 5H:
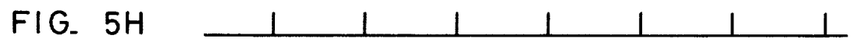
Figure 5I:
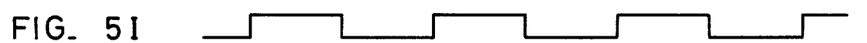
Figure 5J:
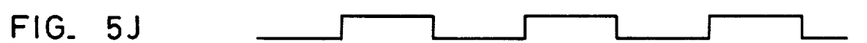
Figure 5K:
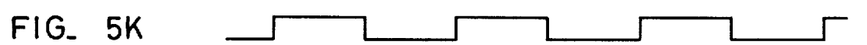
Figure 5L:
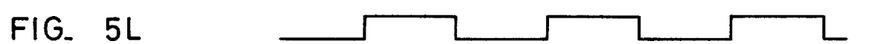
Figure 5M:
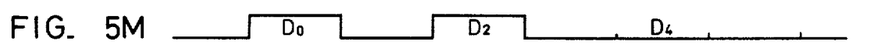
Figure 5N:
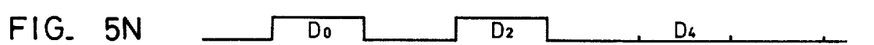
Figure 5O:
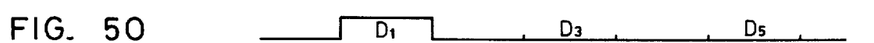
Figure 5P:
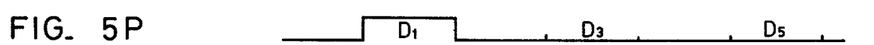

Similarly, the clock signals (FIGS. 5G and H) from the terminal 22 and 32 are also spatially divided into clock signals of the 2mth and (2m+1)th time slots, as shown in FIGS. 5I, J and K, L respectively. These clock signals each have a width of one time slot and a period of two time slots. In the gates 36 and 37, the clock signals (FIGS. 5I and K) from the first stage outputs of the shift registers 33 and 34 are respectively controlled by the data of FIG. 5E, that is, the output from the flip-flop 17a. The gates 36 and 37 provide the outputs shown in FIGS. 5M and N, respectively. At the same time, in the gates 38 and 39, the clock signals (FIGS. 5J and L) from the second stage outputs of the shift registers 33 and 34 are respectively controlled by the data of FIG. 5F, to produce the outputs shown in FIGS. 5O and P, respectively. The gates 36 to 39 each comprise a logical circuit for controlling each of the spatially divided clock signals by the corresponding one of the spatially divided data.

Figure 5Q:
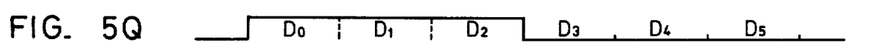
Figure 5R:
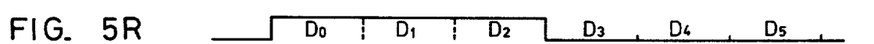

The outputs from the gates 36 and 38 are time multiplexed by an OR gate 41 which forms a multiplexing circuit. Similarly, the outputs from the gates 37 and 39 are also time multiplexed by an OR gate 42, so that the gates 41 and 42 provide the outputs shown in FIGS. 5Q and R, respectively. As will be understood from a comparison between the logical waveforms of FIGS. 5Q and R and the input logical waveform of FIG. 5A, the former waveforms are those obtained by shifting the phase of the latter waveform to the phases of the timing signals (FIGS. 5G and H) derived from the terminals 22 and 32 respectively. Accordingly, by selecting the phases of the clock signals applied to the terminals 22 and 32, the logical waveforms, in which the input data is changed in phase, are derived from the OR gates 41 and 42 respectively. In other words, waveforms corresponding to the various timings available at the output of the gate 23 in FIG. 2 can be obtained by the OR gate 41 or 42. In this case, since the data for each time slot of the input data is extended to a length of two time slots, the data $D_0$ of two time-slot length, for example, can be outputted from the OR gate 41 or 42 at an arbitrary timing during a period $T_2$ except the set-up time Ts and the hold-off time Th respectively preceding and following the data $D_0$, as shown in FIG. 5E. In particular, the input data can be modified into data of an arbitrary timing having one time slot, and further, the timing can be varied to be in excess of one time slot. In the case of this timing modification alone, it will suffice to provide only the data dividing circuit 20, the clock signal dividing shift register 33 and the gates 36, 38 and 41.

Moreover, when such an arrangement is made it is possible to obtain NRZ, RZ and like waveforms as well as the waveform in which the timing of the input data is altered. To this end, the output from the OR gate 41 is applied to AND gates 43 and 44 for selection use; the inverted output from the OR gate 41 is provided to AND gates 45 and 46 for selection use; the output from the OR gate 42 is supplied to AND gates 47 and 48 for selection use; and the inverted output from the OR gate 42 is provided to gates 49 and 50 for selection use. These select gates 43 to 50 respectively are supplied with waveform select signals via terminals 51 to 58, whereby one of the gates 43, 45, 47 and 49 and one of the gates 44, 46, 48 and 50 are selected.

The outputs from the gates 43 and 45 are wired-OR'ed with each other, and the resulting output is provided to an AND gate 61. The output from the gates 47 and 49 are wired-OR'ed with each other, and the resulting output is applied to an AND gate 62. The outputs from the gates 44 and 46 are wired-OR'ed with each other, and the resulting output is supplied to an AND gate 63. The outputs from the gates 48 and 50 are wired-OR'ed with each other, and the resulting output is provided to an AND gate 64. To the gates 61 and 63, the clock signal from the terminal 22 via a delay circuit 65 is applied, and to the gates 62 and 64 the clock signal from the terminal 32 via a delay circuit 66 is applied. The delay times of the delay circuits 65 and 66 are selected to correspond to delays caused by the shift registers 33 and 34 and the gates 36 to 39, 41, 42 and 43 to 50. The outputs from the gates 61 and 62 are wired-OR'ed with each other, and the resulting output is applied to a set terminal of a flip-flop 67. Similarly, the outputs from the gates 63 and 64 are wired-OR'ed with each other, and the resulting output is supplied to a reset terminal of the flip-flop 67, whose output Q is provided at the output terminal 28. The outputs from the select gates 43, 45, 44 and 46 determine, together with the output from the delay circuit 65, the timing of the rise or fall of the desired waveform, whereas the outputs from the select gates 47, 49, 48 and 50 determine, together with the output from the delay circuit 66, the timing of the rise or fall of the waveform.

Figure 5S:
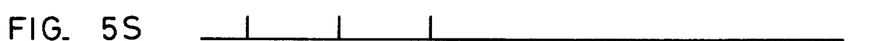
Figure 5T:
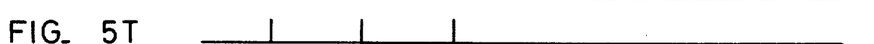
Figure 5U:
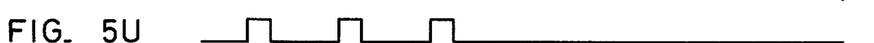

Assuming that an RZ waveform is selected, the terminals 51 and 56 are made high-level, whereby the select gates 43 and 48 are selected. Accordingly, in the example of FIG. 5, the waveform of FIG. 5Q passes through the gate 43, and the coincidence of this waveform with the clock signal from the terminal 22 is detected by the gate 61 to obtain the output shown in FIG. 5S. Further, the wavefrom of FIG. 5R passes through the gate 48, and the coincidence of this waveform with the clock signal from the terminal 32 is detected by the gate 64 to provide the output shown in FIG. 5T. By the outputs from the gates 61 and 64, the flip-flop 67 is set and reset to derive, at the terminal 28, an RZ waveform as shown in FIG. 5U.

An inverted waveform of the RZ waveform can be obtained by opening the select gates 44 and 47. For obtaining an NRZ waveform, the select gates 43 and 46 are opened, and for obtaining its inverted waveform, the select gates 45 and 44 are opened. By selectively opening the select gates 43 to 50 in this way, various waveforms can be obtained, and their timing can be varied for more than one time slot by adjusting the timings of the clock signals at the terminals 22 and 32.

Figure 5V:
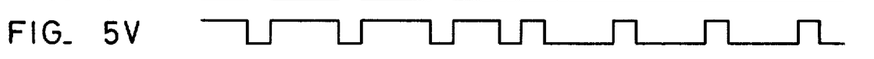
Figure 6:
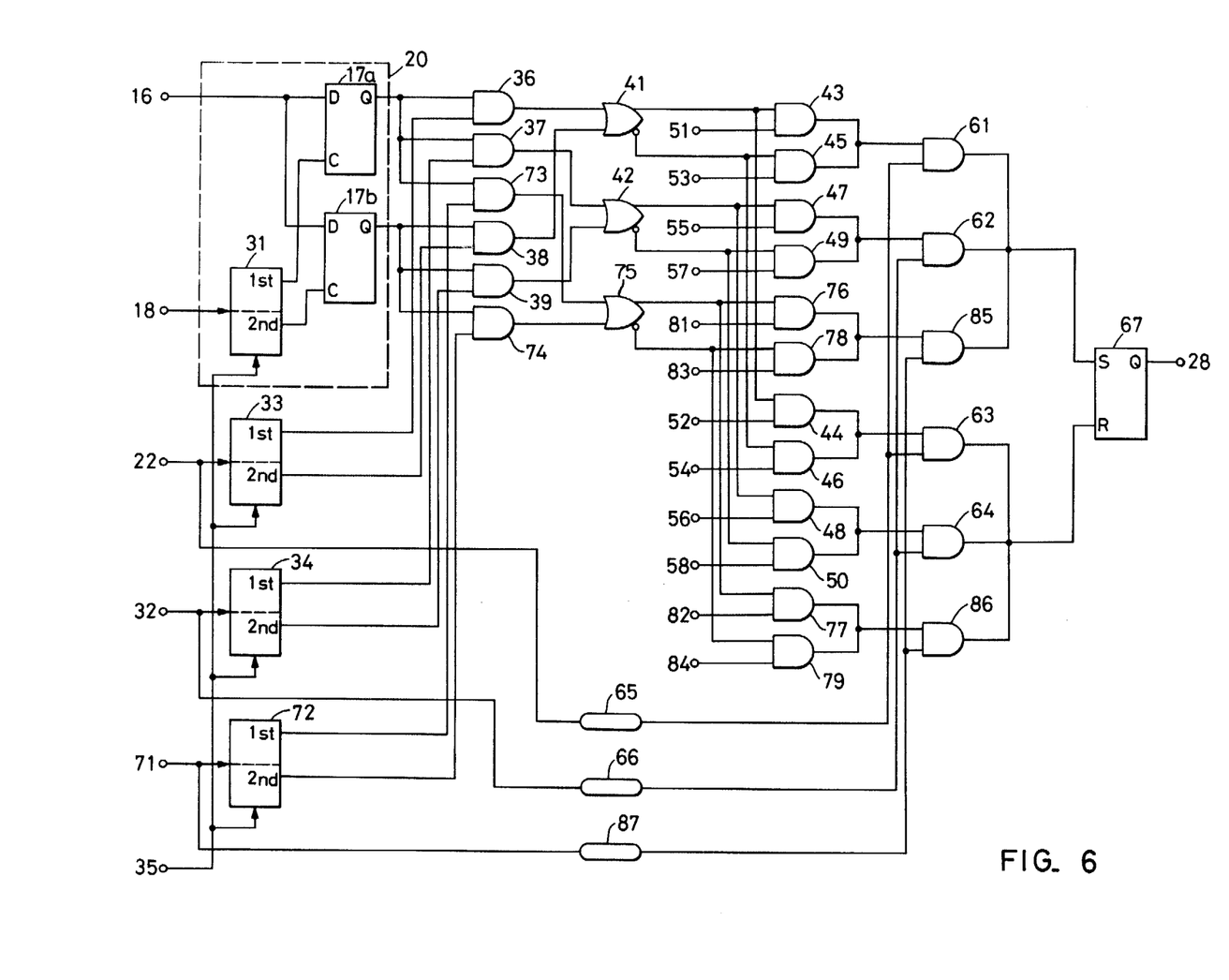
FIG. 6 is a logical circuit diagram showing another embodiment of the logical waveform generator of the present invention.

For testing logical circuit elements, use is often made of an EOR waveform as well as the RZ and NRZ waveforms. The EOR waveform is such as shown in FIG. 5V, and for obtaining this waveform, it is necessary to convert the input data into data having three timings. To this end, for example, as shown in FIG. 6, a clock terminal 71 is added to the device shown in FIG. 6, and a clock signal whose timing can be selected is applied to the terminal 71. This clock signal is spatially divided, for each time slot, by a shift register 72 into clock signals which have a period of two time slots. The first and second stage outputs from the shift register 72, thus divided, are respectively applied to gates 73 and 74, wherein they are respectively controlled by the divided data from the flip-flops 17a and 17b of the data dividing circuit 20. The outputs from the gates 73 and 74 are provided to a multiplexing OR gate 75 to derive therefrom data which is the result of the input data from the terminal 16 being converted into the timing of the clock signal from the terminal 71. The output from the gate 75 is fed to select gates 76 and 77, and an inverted output from the gate 75 is provided to select gates 78 and 79. To the select gates 76 to 79, terminals 81 to 84 which are supplied with waveform select signals, respectively, are connected. The outputs from the gates 76 and 78 are wired-OR'ed with each other, and the resulting output is applied to an AND gate 85, wherein it is compared with the clock signal from the terminal 71 to detect coincidence therebetween. The outputs from the gates 77 and 79 are also wired-OR'ed with each other, and the resulting output is applied to an AND gate 86, wherein it is compared with the clock signal from the terminal 71 to detect coincidence therebetween. The output from the gate 85 is wired-OR'ed with the outputs from the gates 61 and 62, whereas the output from the gate 86 is also wired-OR'ed with the outputs from the gates 63 and 64. Between the terminal 71 and the gates 85 and 86 there is connected a delay circuit 87 which is similar to the delay circuits 65 and 66.

Figure 7A:
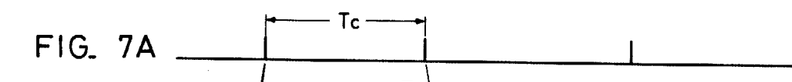
Figure 7B:
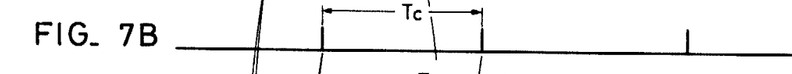
Figure 7C:
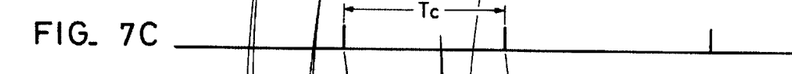
Figure 7D:
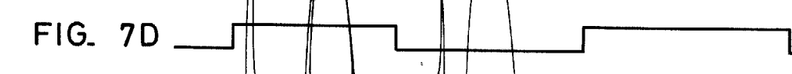
Figure 7E:
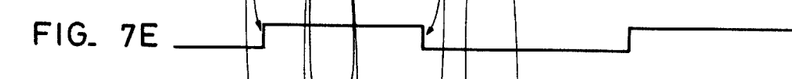
Figures 7F, 7G:
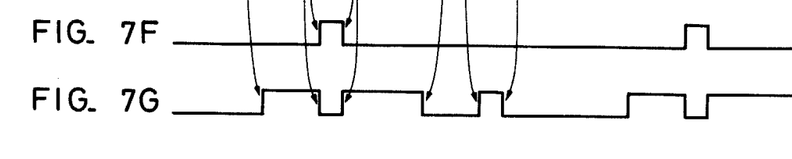

In the device illustrated in FIG. 6, assuming that clock signals on the output sides of the delay circuits 65, 66 and 87 are these shown in FIGS. 7A, B and C respectively, to obtain the NRZ waveform, the select gates 43 and 46 are opened, and the rise and fall of the input data are determined by the clock signal of FIG. 7A to provide an output in which the timing of input data (FIG. 7D) has been changed, as shown in FIG. 7E. To produce the RZ waveform, the select gates 47 and 77 are opened, thereby providing a waveform as shown in FIG. 7F which, in the case of the input data being logic "1", rises with the clock signal of FIG. 7B and falls with the immediately succeeding clock signal of FIG. 7C. To produce the EOR waveform, the select gates 43, 49, 76, 44, 48 and 79 are opened. As shown in FIG. 7G, when the input data becomes logic "1", a waveform is produced which rises with the output from the gate 43 and the clock signal of FIG. 7A, falls with the clock signal of FIG. 7B and the output from the gate 48 and then rises with the next clock signal of FIG. 7C and the output from the gate 76. When the input data becomes logic "0", a waveform is produced which falls with the output from the gate 46 and the clock signal of FIG. 7A, rises with the clock signal of FIG. 7B and the output from the gate 49 and then falls with the next clock signal of FIG. 7C and the output from the gate 79.

Although, in the foregoing, the input data is spatially divided into two, it is also possible to sequentially divide the input data for each time slot into n data and to extend each of the divided data to have an effective period of n time slots. In this case, the clock signal is also spatially divided by n. This enables the input logical data to be converted into a waveform which occurs at an arbitrary timing within a period $nTc-(Ts+Th)$. Accordingly, as described above with respect to FIG. 1, logical circuit elements can be completely tested, and those having high speed operation can also be tested.

In FIGS. 4 and 6, it is also possible to employ a toggle flip-flop in place of the shift registers 31, 33, 34 and 72, respectively, to drive it with a corresponding one of the clock signals and use its output Q and $\overline{Q}$. That is, as the clock dividing circuits, a binary counter which counts the clock signal, can be used. In the case of dividing the clock signal by n, an n-step ring counter is employed. By selecting various combinations of the select gates, it is also possible to generate not only the RZ, NRZ and EOR waveforms but also various other waveforms. In particular, by increasing the number of select clock signals, that is, the number of clock terminals 22, 32 and 71, complicated waveforms can be generated. In the case of no waveform selection being performed, for example, the select gates 43 to 50 in FIG. 4 are omitted, and, in accordance with the output waveform, coincidence between the outputs from the OR gates 41 and 42 and the outputs from the delay circuits 65 and 66, respectively, is detected by the gates 61 to 64.

It will be apparent that many modifications and variations may be effected without departing from the scope of the novel concepts of this invention.

What is claimed is:

1. A logical waveform generator comprising:
   means for providing an input logical data train;
   means for providing a first clock signal;
   means for providing a second clock signal having the same period as the first clock signal and phased apart from the first clock signal;
   a data dividing circuit, operatively connected to said means for providing an input logical data train, for sequentially dividing the input logical data train for each time slot into n (where n is an integer larger than 1) data trains which are sequentially displaced one time slot apart in phase, each data block of the n data trains having an n time slot length;
   a first clock signal dividing circuit, operatively connected to said means for providing the first clock signal, for spatially dividing the first clock signal into n clock signals which are displaced one time slot apart in phase and which occur with a period of n time slots;
   a second clock signal dividing circuit, operatively connected to said means for providing the second clock signal, for spatially dividing the second clock signal into n clock signals which are displaced one time slot apart in phase and which occur with a period of n time slots;
   a first logical circuit, operatively connected to said data dividing circuit and to said first clock signal dividing circuit, for controlling the spatially divided first clock signals by the divided input logical data trains corresponding thereto and for providing, as an output, first controlled signals;
   a second logical circuit, operatively connected to said data dividing circuit and to said second clock signal dividing circuit, for controlling the spatially divided second clock signals by the divided input logical data trains corresponding thereto and for providing, as an output, second controlled signals;
   a first multiplexing circuit, operatively connected to said first logical circuit, for time multiplexing the first controlled signals to form a first logical waveform and an inverted first logical waveform;
   a second multiplexing circuit, operatively connected to said second logical circuit, for time multiplexing the second controlled signals to form a second logical waveform and an inverted second logical waveform;
   a first select gate, operatively connected to said second multiplexing circuit, for providing, as an output, the inverted second logical waveform;
   a second select gate, operatively connected to said second multiplexing circuit, for providing, as an output, the second logical waveform;
   a first AND gate, operatively connected to said first multiplexing circuit and to said means for providing the first clock signal, for detecting a coincidence between the first logical waveform and the first clock signal;
   a second AND gate, operatively connected to said first multiplexing circuit and to the means for providing the first clock signal, for detecting a coincidence between the inverted first logical waveform and the first clock signal;
   a third AND gate, operatively connected to said second select gate and to the means for providing the second clock signal, for detecting a coincidence between the output from the second select gate and the second clock signal; and
   a flip-flop operatively connected to said first, second and third AND gates, said flip-flop set by the output of said first AND gate and reset by the output of said second and third AND gates, to provide an output logical waveform.

2. A logical waveform generator as set forth in claim 1, further comprising:
   a third select gate, operatively connected to said first multiplexing circuit and to said first AND gate, for providing the first logical waveform to said first AND gate;

a fourth select gate, operatively connected to said first multiplexing circuit and to said first AND gate, for providing the inverted first logical waveform to said first AND gate.

3. A logical waveform generator comprising:
means for providing an input logical data train;
means for providing a first clock signal;
means for providing a second clock signal having the same period as the first clock signal and phased apart from the first clock signal;
a data dividing circuit for sequentially dividing the input logical data train for each time slot into n (where n is an integer larger than 1) data trains which are sequentially displaced one time slot apart in phase, each data bock of the n data trains having an n time slot length;
a first clock signal dividing circuit, operatively connected to said means for providing the first clock signal, for spatially dividing the first clock signal into n clock signals which are displaced one time slot apart in phase and which occur with a period of n time slots;
a second clock signal dividing circuit, operatively connected to said means for providing the second clock signal, for spatially dividing the second clock signal into n clock signals which are displaced one time slot apart in phase and which occur with a period of n time slots;
a first logical circuit, operatively connected to said data dividing circuit and to said first clock signal dividing circuit, for controlling the spatially divided clock signals by the divided input logical data trains corresponding thereto and for providing, as an output, first controlled signals;
a second logical circuit, operatively connected to said data dividing circuit and to said second clock signal dividing circuit, for controlling the spatially divided second clock signals by the divided input logical data trains corresponding thereto and for providing, as an output, second controlled signals;
a first multiplexing circuit, operatively connected to said first logical circuit, for time multiplexing the first controlled signals to form a first logical waveform and an inverted first logical waveform;
a second multiplexing circuit, operatively connected to said second logical circuit, for time multiplexing the second controlled signals to form a second logical waveform and an inverted second logical waveform;
select means, operatively connected to said first and second multiplexing circuits, for selecting at least two of the first logical waveform, the inverted first logical waveform, the second logical waveform, and the inverted second logical waveform;
first and second AND gates, operatively connected to said select means, for detecting a coincidence between the selected waveforms and the first clock signal; and
a flip-flop operatively connected to said first and second AND gates, said flip-flop set and reset in dependence upon the outputs from said first and second AND gates to provide an output logical waveform.

4. A logical waveform generator as set forth in claim 3, further comprising:
means for providing a third clock signal having the same period as the first clock signal and phased apart from the first clock signal;
a third clock signal dividing circuit for spatially dividing the third clock signal into n clock signals which are displaced one time slot apart in phase;
a third logical circuit, operatively connected to said data dividing circuit and to said third clock signal dividing circuit, for controlling the spatially divided third clock signals by the divided input logical trains corresponding thereto and for generating third controlled signals;
a third multiplexing circuit, operatively connected to said third logical circuit, for time multiplexing the third controlled signals to form a third logical waveform and an inverted third logical waveform, wherein said select means further includes means for selecting the third logical waveform and the inverted third logical waveform;

5. A logical waveform generator as set forth in claim 1, 2, 3 or 4, wherein said data dividing circuit comprises:
means for providing a timing signal;
a shift register for receiving the timing signal and for generating first and second shift pulse signals;
a first flip-flop, operatively connected to said shift register, for receiving the input logical data train and the first shift pulse signal, and for providing, as an output, a first divided partial input logical data train; and
a second flip-flop, operatively connected to said shift register, for receiving said input logical data train and said second shift pulse signal, and for generating a second divided partial input logical data train, said first and second divided partial input logical data trains comprising said divided input logical data train.

6. A logical waveform generator comprising:
means for providing an input logical data train;
means for providing a first clock signal;
means for providing a second clock signal having the same period as the first clock signal and phased apart from the first clock signal;
a data dividing circuit, operatively connected to said means for providing an input logical data train, for sequentially dividing the input logical data train for each time slot into n (where n is an integer larger than 1) data trains which are sequentially displaced one time slot apart in phase, each data block of the n data trains having an n time slot length;
a first clock signal dividing circuit, operatively connected to said means for providing the first clock signal, for spatially dividing the first clock signal into n clock signals which are displaced one time slot apart in phase and which occur with a period of n time slots;
a second clock signal dividing circuit, operatively connected to said means for providing the second clock signal, for spatially dividing the second clock signal into n clock signals which are displaced one time slot apart in phase and which occur with a period of n time slots;
a first logical circuit, operatively connected to said data dividing circuit and to said first clock signal dividing circuit, for controlling the spatially divided first clock signals by the divided input logical data trains corresponding thereto and for providing, as an output, first controlled signals;
a second logical circuit, operatively connected to said data dividing circuit and to said second clock signal dividing circuit, for controlling the spatially divided second clock signals by the divided input logical data trains corresponding thereto and for providing, as an output, second controlled signals;

a first multiplexing circuit, operatively connected to said first logical circuit, for time multiplexing the first controlled signals to form a first logical waveform and an inverted first logical waveform;

a second multiplexing circuit, operatively connected to said first logical circuit, for time multiplexing the second controlled signals to form a second logical waveform and an inverted second logical waveform;

a first AND gate, operatively connected to said first multiplexing circuit and to said means for providing the first clock signal, for detecting a coincidence between the first logical waveform and the first clock signal;

a second AND gate, operatively connected to said first multiplexing circuit and to the means for providing the first clock signal, for detecting a coincidence between the inverted first logical waveform and the first clock signal;

a third AND gate, operatively connected to said second multiplexing circuit and to the means for providing the second clock signal, for detecting a coincidence between the second logical waveform and the second clock signal;

a fouth AND gate, operatively connected to said second multiplexing circuit and to the means for providing the second clock signal, for detecting a coincidence between the inverted second logical waveform and the second clock signal; and a flip-flop operatively connected to said first, second, third and fourth AND gates, said flip-flop set by the outputs of said first and forth AND gates and reset by the output of said second and third AND gates, to provide an output logical waveform.

7. A logical waveform generator as set forth in claim 6, further comprising:

select means, operatively connected between said first and second multiplexing circuits and said first, second, third and fourth AND gates, for selecting at least two of the first logical waveform, the inverted first logical waveform, the second logical waveform, and the inverted second logical waveform and for providing the selected waveforms to said first, second, third and fourth AND gates.

* * * * *